United States Patent
Yonekawa

(10) Patent No.: US 10,547,019 B2
(45) Date of Patent: Jan. 28, 2020

(54) ELECTROCHEMICAL LUMINESCENT CELL AND COMPOSITION FOR FORMING LUMINESCENT LAYER OF ELECTROCHEMICAL LUMINESCENT CELL

(71) Applicant: NIPPON CHEMICAL INDUSTRIAL CO., LTD., Tokyo (JP)

(72) Inventor: Fumihiro Yonekawa, Tokyo (JP)

(73) Assignee: NIPPON CHEMICAL INDUSTRIAL CO., LTD., Tokyo (JP)

( * ) Notice: Subject to any disclaimer, the term of this patent is extended or adjusted under 35 U.S.C. 154(b) by 43 days.

(21) Appl. No.: 15/516,979

(22) PCT Filed: Oct. 6, 2015

(86) PCT No.: PCT/JP2015/078277
§ 371 (c)(1),
(2) Date: Apr. 5, 2017

(87) PCT Pub. No.: WO2016/056529
PCT Pub. Date: Apr. 14, 2016

(65) Prior Publication Data
US 2017/0294616 A1     Oct. 12, 2017

(30) Foreign Application Priority Data

Oct. 9, 2014 (JP) ................................ 2014-208431
Sep. 30, 2015 (JP) ................................ 2015-193167

(51) Int. Cl.
*H01L 51/50* (2006.01)
*C09K 11/07* (2006.01)
*F21K 2/08* (2006.01)

(52) U.S. Cl.
CPC .......... *H01L 51/5032* (2013.01); *C09K 11/07* (2013.01); *F21K 2/08* (2013.01); *H01L 51/504* (2013.01); *C09K 2211/10* (2013.01)

(58) Field of Classification Search
CPC ... H01L 51/5032; H01L 51/504; C09K 11/07; C09K 2211/10; F21K 2/08
See application file for complete search history.

(56) References Cited

U.S. PATENT DOCUMENTS 5,682,043 A   10/1997   Pei et al.
8,652,354 B2   2/2014   Chen et al.
(Continued)

FOREIGN PATENT DOCUMENTS

CN   102782083 A   11/2012
JP   2000-67601 A   3/2000
(Continued)

OTHER PUBLICATIONS

Extended European Search Report dated Jul. 26, 2017 issued in Application No. 15848287.7 (PACT/JP2015/078277).
(Continued)

*Primary Examiner* — M. A. Golub-Miller
(74) *Attorney, Agent, or Firm* — Westerman, Hattori, Daniels & Adrian, LLP

(57) ABSTRACT

Provided is an electrochemical luminescent cell 10 having a luminescent layer 12 and electrodes 13, 14 provided on each surface of the luminescent layer 12. The luminescent layer 12 comprises an organic polymeric luminescent material and a combination of at least two organic salts. In particular, the luminescent layer preferably comprises a combination of at least two types of ionic liquids represented by formula (1) (wherein $R_1$, $R_2$, $R_3$ and $R_4$ each represent an optionally-substituted alkyl group, alkoxy alkyl group, trialkylsilylalkyl group, alkenyl group, alkynyl group, aryl group or heterocylic group. $R_1$, $R_2$, $R_3$ and $R_4$ may be the same or different. M represents N or P. $X^-$ represents an anion.)

10 Claims, 7 Drawing Sheets

(56) References Cited

U.S. PATENT DOCUMENTS

| | | |
|---|---|---|
| 9,935,270 B2 * | 4/2018 | Yonekawa ............... F21K 2/08 |
| 2005/0123797 A1 | 6/2005 | Kondakova et al. |
| 2009/0243502 A1 | 10/2009 | Kizaki et al. |
| 2011/0057151 A1 * | 3/2011 | Chen ...................... C09D 11/10 |
| | | 252/301.35 |
| 2012/0019161 A1 | 1/2012 | Edman et al. |
| 2012/0049120 A1 | 3/2012 | Chen et al. |
| 2012/0091446 A1 | 4/2012 | Jung et al. |

FOREIGN PATENT DOCUMENTS

| | | |
|---|---|---|
| JP | 2011-103234 A | 5/2011 |
| JP | 2011-216893 A | 10/2011 |
| JP | 2012-516033 A | 7/2012 |
| JP | 2012-531737 A | 12/2012 |
| JP | 2013-171968 A | 9/2013 |
| WO | 2010/098386 A1 | 9/2010 |
| WO | 2011/032010 A1 | 3/2011 |
| WO | 2013/171872 A1 | 11/2013 |

OTHER PUBLICATIONS

International Search Report dated Dec. 15, 2015, issued in counterpart International Application No. PCT/JP2015/078277 (1 page).

* cited by examiner

ELECTROCHEMICAL LUMINESCENT CELL AND COMPOSITION FOR FORMING LUMINESCENT LAYER OF ELECTROCHEMICAL LUMINESCENT CELL

TECHNICAL FIELD

The present invention relates to a light-emitting electrochemical cell having a light-emitting layer containing a light-emitting material and two or more organic salts. The present invention also relates to a composition for forming a light-emitting layer of a light-emitting electrochemical cell.

BACKGROUND ART

In recent years, rapid progress has been made in development of an organic electroluminescent (organic EL) element, which is a self-emitting element using electrons and holes as carriers. The organic EL element is characterized by a possibility of reducing thickness and weight, good visibility, and the like, compared to those of a liquid crystal element that is a non-self-emitting element which requires a back light.

The organic EL element is generally provided with: a pair of substrates each having an electrode formed on the respective faces opposing to each other; and a light-emitting layer disposed between the pair of substrates. The light-emitting layer is composed of an organic thin film containing a light-emitting substance that emits light when voltage is applied. In the case where such an organic EL is made to emit light, holes and electrons are injected from an anode and a cathode by applying voltage to the organic thin film. Thereby, the holes and electrons are recombined in the organic thin film, and light emission can be obtained when excitons generated by the recombination return to the ground state.

In the organic EL element, a hole injection layer and an electron injection layer for improving efficiency of injecting holes and electrons, and a hole transport layer and an electron transport layer for improving efficiency of recombination of holes and electrons need to be provided between the light-emitting layer and the electrode in addition to the light-emitting layer. By providing such layers, the organic EL element has a multilayer structure, which makes the structure complicated and increases production process. Moreover, the organic EL has a lot of restrictions because a working function needs to be taken into consideration in selecting electrode materials for use in the anode and the cathode.

As a self-emitting element to deal with these problems, light-emitting electrochemical cells (LECs) have been attracting attention in recent years. A light-emitting electrochemical cell generally has a light-emitting layer containing a salt and a light-emitting organic substance. When voltage is applied, cations and anions derived from the salt move toward a cathode and an anode respectively in the light-emitting layer, which brings about a large electric field gradient (electric double layer) in the electrode interfaces. The electric double layer to be formed makes the injection of electrons and holes in the cathode and the anode easy, and therefore the light-emitting electrochemical cell does not need a multilayer structure which is necessary for organic EL elements. Moreover, the light-emitting electrochemical cell does not need to take into consideration a working function of a material to be used as a cathode or an anode and therefore has less restrictions for the materials. From these reasons, the light-emitting electrochemical cell has been expected as a self-emitting element that can reduce production costs greatly when compared with organic EL elements.

Besides a lithium salt and a potassium salt, attempts to use an ionic liquid as the salt for use in light-emitting electrochemical cells have been made. The ionic liquid is a nonvolatile salt and has a high rate of re-orientation by an electric field than solid electrolytes, and therefore mobility of ions is secured to make the formation of an electric double layer easy and make the injection of holes and electrons further easy (refer to Patent Literature 1 and Patent Literature 2).

In the organic EL elements, attempts to make the transfer of holes and electrons easy by adding an additive to a layer which takes on a role of injecting or transporting holes or electrons, such as a hole injection layer, a hole transport layer, an electron injection layer, or an electron transport layer have been made (refer to, for example, Patent Literatures 3 to 6). Moreover, attempts to avoid reduction in light emission luminance by adjusting the balance of injecting holes and electrons to a light-emitting layer have also been made (refer to Patent Literature 7).

On the other hand, the transfer of holes and electrons is already easy in light-emitting electrochemical cells, particularly in light-emitting electrochemical cells having a light-emitting layer containing an ionic liquid; however, attempts to improve the performance of light-emitting electrochemical cells by improving thermal stability and electrochemical stability that give an influence on operating life or by improving adaptability of an ionic liquid with a light-emitting substance have been made. For example, it is described in Patent Literature 8 that the life and the like of light-emitting electrochemical cells are improved when a plurality of salts are incorporated in the light-emitting polymer layer. However, the maximum light emission luminance shown in the literature is merely 100 cd/m$^2$ or lower even when a voltage of 10 V or higher is applied to the electrodes, and therefore a high luminance required in practical use has not been achieved.

CITATION LIST

Patent Literature

[Patent Literature 1]
Japanese Patent Laid-Open No. 2011-103234
[Patent Literature 2]
National Publication of International Patent Application No. 2012-516033
[Patent Literature 3]
Japanese Patent Laid-Open No. 2013-171968
[Patent Literature 4]
National Publication of International Patent Application No. 2012-531737
[Patent Literature 5]
Japanese Patent Laid-Open No. 2011-216893
[Patent Literature 6]
International Publication No. WO 201098386
[Patent Literature 7]
International Publication No. WO 2013171872
[Patent Literature 8]
International Publication No. WO 2011032010

SUMMARY OF INVENTION

Technical Problem

It is considered that improving the efficiency of transporting holes and electrons and adjusting the balance of ability of injecting holes and electrons from respective electrodes are essential to improve the light emission efficiency of a light-emitting electrochemical cell. That is, if either of holes or electrons are injected in a large amount upon injection of holes and electrons from respective electrodes, the holes or electrons exist excessively in the light-emitting layer, and it is considered that this inhibits the transportation to lower the light emission efficiency or gives an influence on the light emission luminance.

The present inventors have conducted diligent studies to solve the problems and found that the ability of injecting holes or electrons from respective electrodes can be controlled when taking the kinds of cations or anions in the salt for use in the light-emitting layer into consideration. Specifically, the present inventors have found that the ability of injecting holes and the ability of injecting electrons into the light-emitting layer can be made almost equal by mixing two or more salts.

Specifically, the present invention has solved the problems by providing a light-emitting electrochemical cell comprising: a light-emitting layer; and electrodes respectively disposed on faces of the light-emitting layer, a light-emitting electrochemical cell comprising: a light-emitting layer; and electrodes respectively disposed on faces of the light-emitting layer, the light-emitting layer comprising: a light-emitting organic polymeric material; and a combination of two or more organic salts.

Moreover, the present invention has solved the problems by providing a composition for forming a light-emitting layer of a light-emitting electrochemical cell, the composition comprising: a light-emitting organic polymeric material; an organic solvent; and a combination of two or more organic salts.

Advantageous Effects of Invention

According to the present invention, a light-emitting electrochemical cell having a high light emission efficiency and an excellent light emission luminance is provided.

BRIEF DESCRIPTION OF DRAWINGS

FIG. 2 is a conceptual diagram illustrating a light emission mechanism of a light-emitting electrochemical cell.

DESCRIPTION OF EMBODIMENTS

Figure 1:
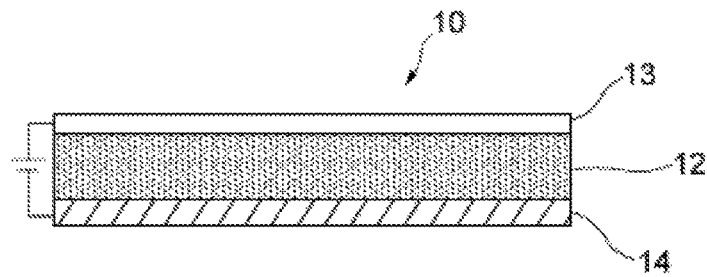
FIG. 1 is a schematic sectional view of a light-emitting electrochemical cell of an embodiment according to the present invention.

Hereinafter, preferred embodiments of a light-emitting electrochemical cell according to the present invention will be described with reference to the accompanying drawings. As illustrated in FIG. 1, a light-emitting electrochemical cell 10 according to the present embodiments has a light-emitting layer 12 and electrodes 13, 14 respectively disposed on faces of the light-emitting layer. The light-emitting electrochemical cell 10 is provided with the first electrode 13 and the second electrode 14 which are a pair of electrodes opposing to each other and the light-emitting layer 12 held therebetween. When voltage is applied to the light-emitting electrochemical cell 10, the light-emitting layer emits light. The light-emitting electrochemical cell 10 is used as various kinds of displays. In FIG. 1, a state is illustrated in which a direct-current power source is used as a power source, the first electrode 13 is connected to the anode of the power source, and the second electrode 14 is connected to the cathode. In contrast to the illustration in the figure, the first electrode 13 may be connected to the cathode, and the second electrode 14 may be connected to the anode. Moreover, an alternating-current power source can also be used as the power source in place of the direct-current power source.

The first electrode 13 and the second electrode 14 may be transparent electrodes having translucency or may be semitransparent or opaque electrodes. Examples of the transparent electrode having translucency include electrodes made of a metal oxide such as an indium-doped tin oxide (ITO) or a fluorine-doped tin oxide (FTO), electrodes made of a polymer having transparency such as an impurity-added poly(3,4-ethylenedioxythiophene) (PEDOT), and electrodes made of a carbon-based material such as a carbon nano tube or graphene. Examples of the semitransparent or opaque electrode include metallic materials such as aluminum (Al), silver (Ag), gold (Au), platinum (Pt), tin (Sn), bismuth (Bi), copper (Cu), chromium (Cr), zinc (Zn), and magnesium (Mg).

It is preferable that at least one of the first electrode 13 and the second electrode 14 be a transparent electrode because the light emitted from the light-emitting layer 12 can easily be taken outside. Moreover, it is preferable that the one and the other be a transparent electrode and an opaque metallic electrode, respectively, because the light emitted from the light-emitting layer 12 can be reflected by the metallic electrode to be taken outside. Further, both the first electrode 13 and the second electrode 14 may be transparent electrodes to produce a see-through light emitter. Furthermore, the light-emitting electrochemical cell 10 can also be designed to serve as a laser oscillation element by making both the first electrode 13 and the second electrode 14 of metallic electrodes each made of Ag or the like that is a material having a high reflectance, and adjusting the film thickness of the light-emitting layer 12.

In the case where the first electrode 13 and the second electrode 14 are a transparent electrode and an opaque or semitransparent metallic electrode, respectively, it is preferable that the first electrode 13 have a thickness of, for example, 10 nm or more and 500 nm or less in view of realizing appropriate resistivity and optical transparency. Similarly to the first electrode 13, it is preferable that the second electrode 14 have a thickness of, for example, 10 nm or more and 500 nm or less in view of realizing appropriate resistivity and optical transparency.

The light-emitting layer 12 is a layer of a mixture of a light-emitting organic polymeric material and organic salts. The light-emitting layer 12 may be in any of a solid form and a liquid form. In the case where the light-emitting layer 12 is in a solid form, a certain shape can be maintained to resist against the force applied from outside.

The organic salt contained in the light-emitting layer 12 is a substance for securing the mobility of ions to make it easy to form an electric double layer and inject holes and electrons. In the present embodiments, phosphonium salts, ammonium salts, pyridinium salts, imidazolium salts, pyrrolidinium salts, and the like can be used as the organic salt. Among these organic salts, an organic salt, for example, represented by formula (1), which will be mentioned later, can be used as the phosphonium salt or the ammonium salt. As the pyridinium salt, the imidazolium salt, and the pyrrolidinium salt, the pyridinium salts, the imidazolium salts, and the pyrrolidinium salts in which the anion is, for example, a halide ion of fluorine, bromine, iodine, chlorine, or the like, tetrafluoroborate ($BF_4$), benzotriazolate ($N_3(C_6H_4)$), tetraphenylborate ($B(C_6H_5)_4$), hexafluorophosphate ($PF_6$), bis(trifluoromethylsulfonyl)imide ($N(SO_2CF_3)_2$), bis(fluorosulfonyl)imide ($N(SO_2F)_2$), trifluoromethanesulfonate ($SO_3CF_3$), methanesulfonate ($SO_3CH_3$), tris(pentafluoroethyl)trifluorophosphate ($(C_2H_5)_3PF_3$), trifluoroacetate ($CF_3COO$), an amino acid, bisoxalatoborate ($B(C_2O_4)_2$), p-toluenesulfonate ($SO_3C_6H_4CH_3$), thiocyanate (SCN), dicyanamide ($N(CN)_2$), a dialkyl phosphate (($RO)_2POO$), a dialkyl dithiophosphate (($RO)_2PSS$), an aliphatic carboxylate (RCOO), or the like can be used. It is preferable that the molecular weight of a cation in the organic salt be 270 or higher and 900 or lower, particularly preferably 300 or higher and 850 or lower, and especially preferably 330 or higher and 800 or lower in view of further enhancing the light emission efficiency of a light-emitting electrochemical cell and making the light emission luminance further excellent.

The organic salt may be solid or liquid at normal temperature (25° C.). Among the organic salts, an organic salt, for example, represented by the following formula (1) can be used as a solid organic salt.

[Formula 1]

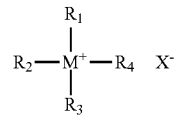

(1)

wherein $R_1$, $R_2$, $R_3$, and $R_4$ each represent an alkyl group, an alkoxyalkyl group, a trialkylsilylalkyl group, an alkenyl group, an alkynyl group, an aryl group, or a heterocyclic group which is optionally substituted with a functional group; $R_1$, $R_2$, $R_3$, and $R_4$ are the same or different; M represents N or P; and $X^-$ represents an anion.

Among organic salts, examples of the liquid organic salt include ionic liquids which maintain their liquid state at normal temperature (25° C.) though ionic species. As the liquid organic salt, the substance, for example, represented by the formula (1) can be used. The organic salt represented by the formula (1) may be in a solid or liquid state depending on the combination of a cation and an anion to be selected or the structures of $R_1$ to $R_4$ which are side chains of a cation.

In the case where a plurality of organic salts each represented by formula (1) are used, all the organic salts may be solid at normal temperature, or all the organic salts may be liquid at normal temperature. Further, at least one of the organic salts may be liquid at normal temperature with at least one of the organic salts being solid at normal temperature.

In the formula (1), each of $R_1$ to $F_4$ can be an alkyl group, an alkoxyalkyl group, a trialkylsilylalkyl group, an alkenyl group, an alkynyl group, an aryl group, or a heterocyclic group. $R_1$ to $F_4$ may be the same or different.

Examples of the alkyl group to be used as any one of $R_1$ to $R_4$ in the formula (1) include straight or branched saturated aliphatic groups having 1 to 20 carbon atoms and saturated alicyclic groups having 3 to 20 carbon atoms. Specific examples include a methyl group, an ethyl group, a propyl group, an isopropyl group, a butyl group, a s-butyl group, a t-butyl group, an isobutyl group, an amyl group, an isoamyl group, a t-amyl group, a hexyl group, a heptyl group, an isoheptyl group, a t-heptyl group, a n-octyl group, an isooctyl group, a 2-ethylhexyl group, a t-octyl group, a nonyl group, an isononyl group, a decyl group, an isodecyl group, an undecyl group, a dodecyl group, a tridecyl group, an isotridecyl group, a tetradecyl group, a hexadecyl group, an octadecyl group, an icosyl group, a cyclopropyl group, a cyclobutyl group, a cyclopentyl group, a cyclohexyl group, a cycloheptyl group, a cyclooctyl group, a cyclononyl group, a cyclohexylmethyl group, and a cyclodecy group.

Examples of the alkoxy group in the alkoxyalkyl group to be used as any one of $R_1$ to $R_4$ in the formula (1) include alkoxides of the alkyl groups described above. Examples of the alkyl group in the alkoxyalkyl group include the same alkyl groups as the alkyl groups described above.

As the alkenyl group to be used as any one of $R_1$ to $R_4$ in the formula (1), alkenyl groups having 2 to 20 carbon atoms are preferably used. Examples of the alkenyl group include straight or branched alkenyl group such as a vinyl group, an allyl group, an isopropenyl group, a 2-butenyl group, a 2-methylallyl group, a 1,1-dimethylallyl group, a 3-methyl-2-butenyl group, a 3-methyl-3-butenyl group, a 4-pentenyl group, a hexenyl group, an octenyl group, a nonenyl group, and a decenyl group.

Examples of the alkynyl group to be used as any one of $R_1$ to $R_4$ in the formula (1) include an ethynyl group and a prop-2-yn-1-yl group.

Examples of the aryl group to be used as any one of $R_1$ to $R_4$ in the formula (1) include a phenyl group, a naphthyl group, and an anthracenyl group. Examples of the heterocyclic group include monovalent groups derived from pyridine, pyrrole, furan, imidazole, pyrazole, oxazole, imidazoline, pyrazine and the like.

One, or two or more of the hydrogen atoms contained in each group described above may be substituted with a functional group. Examples of the functional group include an amino group, a nitrile group, a phenyl group, a benzyl group, a carboxy group, and an alkoxy group having one or more and 12 or less carbon atoms. For example, alkyl groups substituted with a phenyl group as a functional group, namely aromatic alkyl groups can be used. Specifically, a benzyl group in which a methyl group as an alkyl group is substituted with a phenyl group as a functional group can be used.

Examples of the anion that is $X^-$ in the formula (1) include ions of halogens such as fluorine, bromine, iodine, and chlorine, tetrafluoroborate ($BF_4$), benzotriazolate ($N_3$ ($C_6H_4$)), tetraphenylborate ($B(C_6H_5)_4$), hexafluorophosphate ($PF_6$), bis(trifluoromethylsulfonyl)imide ($N(SO_2CF_3)_2$), bis(fluorosulfonyl)imide ($N(SO_2F)_2$), trifluoromethanesulfonate ($SO_3CF_3$), methanesulfonate ($SO_3CH_3$), tris(pentafluoroethyl)trifluorophosphate ($(C_2H_5)_3PF_3$), trifluoroacetate ($CF_3COO$), amino acids, bisoxalatoborate ($B(C_2O_4)_2$), p-toluenesulfonate ($SO_3C_6H_4CH_3$), thiocyanate (SCN), dicyanamide ($N(CN)_2$), dialkyl phosphates (($RO)_2POO$), dialkyl dithiophosphates (($RO)_2PSS$), aliphatic carboxylates (RCOO), dimethyl phosphate ($P(OCH_3)_2(=O)O$), dibutyl phosphate ($P(OC_4H_9)_2(=O)O$), and bis-2-ethylhexylphosphate ($P(O(C_6H_{12})(C_2H_5)))_2(=O)O$).

The light-emitting electrochemical cell 10 according to the present embodiments has a characteristic in that two or more different organic salts are combined and used as the organic salt contained in the light-emitting layer 12. By combining two or more organic salts and using them, the ability of injecting holes and the ability of injecting electrons into the light-emitting layer 12 are made almost equal, so that the light emission efficiency can be enhanced. When the light emission efficiency is enhanced, the light-emitting electrochemical cell 10 according to the present embodiments has an excellent light emission luminance.

Examples of the combination of two or more organic salts include, taking combinations of two for example, (I) combinations of organic salts whose cations and anions are the same and different, respectively; (II) combinations of organic salts whose cations and anions are different and the same, respectively; and (III) combinations of organic salts whose cations and anions are both different. Examples of (I) include combinations of organic salts each having in common a pyridinium ion as a cation and each having a different anion among the anions such as a tetrafluoroborate ion and a bis(trifluoromethanesulfonyl)imide ion. Examples of (II) include combinations of organic salts each having in common a tetrafluoroborate ion, a bis(trifluoromethanesulfonyl)imide ion, or the like as an anion and each having a different cation among an imidazolium ion and a pyrrolidinium ion. Examples of (III) include a combination of a salt between a bis(trifluoromethanesulfonyl)imide ion and a pyridinium ion and a salt between a tetrafluoroborate ion and a pyrrolidinium ion.

Among the embodiments of the combination of two or more organic salts, it is preferable that the combination be any one of (I) combinations of organic salts whose cations and anions are the same and different, respectively, and (II) combinations of organic salts whose cations and anions are different and the same, respectively, because it becomes easy to design the composition of the light-emitting layer. In other words, in the case of (III) combinations of organic salts whose cations and anions are both different, a cation A and a cation B exist, and moreover, an anion a and an anion b exist, so that four combinations:

(i) cation A+anion a;
(ii) cation A+anion b;
(iii) cation B+anion a; and
(iv) cation B+anion b are conceivable as the combination of a cation and an anion in the light-emitting layer. All of them exists as organic salts. In short, even though designing is conducted using organic salts in combination of, for example, (i) and (ii), which are originally supposed to be contained, there is a risk that the organic salts of (iii) and (iv) are also mixed, and the possibility cannot be denied that the mixing has an influence on the light emission luminance.

In view of the above, it is preferable that the combination of organic salts be any one of (I) combinations of organic salts whose cations and anions are the same and different, respectively (combination of (i) and (ii) or combination of (iii) and (iv)), and (II) combinations of organic salts whose cations and anions are different and the same (combination of (i) and (iii) or combination of (ii) and (iv)).

Moreover, it is preferable that two or more organic salts be a combination of liquid organic salts. Alternatively, it is also preferable that two or more organic salts be a combination of solid organic salts. Furthermore, the combination of two or more organic salts may be a combination of at least one liquid organic salt and at least one solid organic salt.

Examples of a preferred combination of organic salts include a combination of organic salts represented by formula (1). In this case, when a plurality of different organic salts each represented by formula (1) are combined, it is advantageous to adopt a combination by which the ability of injecting holes and the ability of injecting electrons into the light-emitting layer 12 are made almost equal. As a result of studies conducted by the present inventors, in the case where, for example, a combination of two organic salts is adopted as a plurality of different organic salts each represented by formula (1), it has been proven that the first organic salt and the second organic salt are preferably (I) organic salts whose cations and anions are the same and different, respectively. Moreover, it has also been proven that the first organic salt and the second organic salt are preferably (II) organic salts whose anions and cations are the same and different, respectively.

In the case of (I), the first organic salt and the second organic salt contain the same cation, for example, the same ammonium ion or the same phosphonium ion. The first organic salt and the second organic salt contain a different anion. On the other hand, in the case of (II), the first organic salt and the second organic salt contain the same anion, for example, bis(trifluoromethanesulfonyl)imide, an ion of a halogen such as fluorine or bromine, or an ion of a halogen-containing compound such as tetrafluoroborate ($BF_4$) or hexafluorophosphate ($PF_6$). The first organic salt and the second organic salt contain a different cation. Both the different cations can be ammonium ions. Alternatively, the different cations can be phosphonium ions. Further, one of the different cations can be an ammonium ion, and the other can be a phosphonium ion.

In any of the cases (I) and (II), it is preferable that three of $R_1$, $R_2$, $R_3$, and $R_4$ in formula (1) represent the same alkyl group, and that the other one is an alkyl group that is different from the alkyl group of the cation or an aromatic alkyl group. The reason is that when one of $R_1$, $R_2$, $R_3$, and $R_4$ is a different group, the structure becomes asymmetric, so that the fluidity of the organic salts is easily obtained even though the number of carbon atoms becomes large. The molecular weight of the cation can be made large by making the number of carbon atoms large, so that the charge density becomes small structurally, and therefore the amount of the polar components necessary for stabilizing charges can be reduced, which leads to enhancing compatibility with a light-emitting organic material not having polarity.

Examples of the preferred combination of the first organic salt and the second organic salt include the following: in the case of (I), the cation is the same tetraalkylammonium ion, the same trialkylbenzylammonium ion, the same tetraalkylphosphonium ion, or the same trialkylbenzylphosphonium ion, and the different anions are a combination of an ion of bis(trifluoromethanesulfonyl)imide and an ion of a halogen such as fluorine or bromine or an ion of a halogen-containing compound such as tetrafluoroborate ($BF_4$) or hexafluorophosphate ($PF_6$); and in the case of (II), the same anion is bis(trifluoromethanesulfonyl)imide, an ion of a halogen such as fluorine or bromine, or an ion of a halogen-containing compound such as tetrafluoroborate ($BF_4$) or hexafluorophosphate ($PF_6$), and the different cations are a combination of different tetraalkylammonium ions, a combination of different trialkylbenzylammonium ions, a combination of tetraalkylphosphonium ions, a combination of different trialkylbenzylphosphonium ions, a combination of a tetraalkylammonium ion and a trialkylbenzylammonium ion, a combination of a tetraalkylphosphonium ion and a trialkylbenzylphosphonium ion, a combination of a tetraalkylammonium ion and a trialkylbenzylphosphonium ion, a combination of a tetraalkylphosphonium ion and a trialkylbenzylammonium ion, and a combination of a tetraalkylphosphonium ion and a tetraalkylammonium ion.

The ratio of the first organic salt and the second organic salt can be selected from a wide range according to the kinds of these organic salts. For example, as demonstrated in Examples described later, when the mass ratio of the first organic salt and that of the second organic salt is about the same, the combination may exhibit the highest light emission luminance, or when the mass ratio of the first organic salt and the second organic salt is 20:80 or 80:20, the combination may exhibit the highest light emission luminance.

As described above, the combinations of the first organic salt and the second organic salt are merely examples, and, a combination of, for example, three or more ionic liquids can also be adopted to achieve the object of the present invention of making the ability of injecting holes and the ability of injecting electrons into the light-emitting layer 12 almost equal.

The organic salt represented by formula (1) can be produced, for example, in a manner as described below. In the case where the cation is a phosphonium ion, an ionic liquid in which the anion is a halogen can be obtained using a quaternary phosphonium halide obtained by reacting a tertiary phosphine compound corresponding to the phosphonium cation to be a target with a halogenated hydrocarbon compound. An ionic liquid in which the anionic component is other than a halogen can be obtained by reacting the quaternary phosphonium halide with a metal salt as an anionic component and then conducting anion exchange. For example, an ionic liquid containing: a phosphonium cation in which three of $R_1$, $R_2$, $R_3$, and $R_4$ in formula (1) are alkyl groups with the other one being an aromatic alkyl group; and a halogen as an anionic component can be obtained by using a trialkyl phosphine as the tertiary phosphine compound and, as the halogenated hydrocarbon compound, a compound in which an aromatic alkyl group is coupled with a halogen. Moreover, an organic salt containing: a phosphonium cation in which three of $R_1$, $R_2$, $R_3$, and $R_4$ in formula (1) are alkyl groups with the other one being an aromatic alkyl group; and an anionic component other than a halogen can be obtained by subjecting the organic salt in which the anionic component is a halogen to anion exchange with bis(trifluoromethylsulfonyl)imide, tetrafluoroborate ($BF_4$), hexafluorophosphate ($PF_6$), bis(oxalate)borate ($B(C_2O_4)_2$), thiocyanate (SCN), or the like.

It is preferable that the ratio of the organic salts in the light-emitting layer 12 be 1% by mass or more and 30% by mass or less, and more preferably 5% by mass or more and 20% by mass or less in view of securing the mobility of ions and enhancing a film forming property of the light-emitting layer 12. The content of the organic salts in the light-emitting layer 12 is preferably 10 parts by mass or more and 25 parts by mass or less based on 100 parts by mass of the light-emitting organic polymeric material.

The light-emitting organic polymeric material contained in the light-emitting layer 12, when anions and cation are doped, functions as a carrier body for electrons and holes and is excited by combination of electrons and holes to emit light. Examples of the light-emitting organic polymeric material include various π-conjugated polymers. Specific examples include poly(para-phenylenevinylene), poly(fluorene), poly(1,4-phenylene), polythiophene, polypyrrole, poly(para-phenylene sulfide), polybenzothiadiazole, and polybiothiophene. Moreover, derivatives obtained by introducing a substituent to these polymers, and copolymers of these polymers can also be used as the light-emitting organic polymeric material. Examples of the substituent include alkyl groups having 1 to 20 carbon atoms, alkoxy groups having 1 to 20 carbon atoms, aryl groups having 6 to 18 carbon atoms, and groups represented by [($-CH_2CH_2O-$)$_n CH_3$] (provided that n is an integer of 1 to 10). Furthermore, examples of the copolymer include copolymers obtained by coupling respective repeating units in two or more polymers among the π-conjugated polymers listed above. Examples of the arrangement of repeating units in the copolymer include a random arrangement, an alternate arrangement, a block arrangement, or an arrangement obtained by combining these arrangements. Further, commercially available products can also be used as the light-emitting organic polymeric material. Examples of the commercially available product include PFO-DMP (Poly(9,9-dioctylflurorenyl-2,7-diyl) end capped with dimethyl phenyl) which is a compound available from Luminescence Technology Corp. as the name LT-S934 and (Poly[(9,9-di-n-octylfluorenyl-2,7-diyl)-alt-(benzo[2,1,3]thiadiazol-4,8-diyl)]) which is a compound available from Sigma-Aldrich Co., LLC.

it is preferable that the ratio of these light-emitting organic polymeric materials in the light-emitting layer 12 be 10% by mass or more and 95% by mass or less, and more preferably 20% by mass or more and 90% by mass or less in view of exhibiting the function sufficiently.

The light-emitting layer 12 may contain a substance other than the light-emitting organic polymeric material and the organic salts. Examples of the substance include a surfactant, a polymer component (such as polyethylene oxide) for improving electrical conductivity, a polymer component (such as polystyrene and polymethylmethacrylate (PMMA)) for improving film forming property, and a salt other than the organic salts. It is preferable that the amount of the components (excluding solvents) other than the light-emitting organic polymeric material and the organic salts be 90 parts by mass or less when the whole amount of the light-emitting layer 12 is assumed to be 100 parts by mass, more preferably 60 parts by mass or less, and particularly preferably 30 parts by mass or less.

It is preferable that the film thickness of the light-emitting layer 12 thus composed be 10 nm or more and 200 nm or less, and more preferably 50 nm or more and 150 nm or less. It is preferable that the film thickness of the light-emitting layer 12 be in the range in view that light emission can be obtained sufficiently and efficiently from the light-emitting layer 12, that a defect in a portion to emit light can be suppressed to prevent a short circuit, and the like.

The light-emitting electrochemical cell 10 according to the present embodiments can be produced by, for example, the following production process. First, a substrate provided with the first electrode 13 is prepared. In the case where the first electrode 13 is formed of, for example, ITO, a pattern is formed on the surface of a glass substrate or the like with a vapor deposited film of ITO by a photolithography method or by combining a photolithography method and a lift-off method, so that the first electrode 13 made of ITO can be formed on the surface of the substrate.

Subsequently, the organic salts and the light-emitting organic polymeric material are dissolved in an organic solvent to prepare a composition for forming a light-emitting layer of a light-emitting electrochemical cell. It is preferable to use toluene, benzene, tetrahydrofuran, dimethyl chloride, chlorobenzene, chloroform, or the like as the organic solvent in view of efficiently mixing the organic salts and the light-emitting organic polymeric material, and the like. These organic solvents can be used singly or in combination of two or more. It is preferable that the blend ratio (mass ratio) of the organic salts and the light-emitting organic polymeric material in the composition for forming a light-emitting layer be 1:1 to 20 in terms of the former:the latter. The composition for forming a light-emitting layer is applied on the first electrode 13 of the substrate by a spin coating method or the like. Thereafter, the coating film formed by the application is dried to evaporate the organic solvent, thereby forming the light-emitting layer 12. It is preferable to prepare the composition for forming a light-emitting layer and to form the light-emitting layer 12 under an inert gas atmosphere with a moisture content of 100 ppm or less. Examples of the inert gas in this case include argon, nitrogen, and helium.

Subsequently, the second electrode 14 is formed on the formed light-emitting layer 12. In this case, aluminum (Al) is vapor-deposited in a film form on the light-emitting layer 12 by, for example, a vacuum vapor deposition method through a mask to form an electrode having a predetermined pattern. In this way, the second electrode 14 is formed on the light-emitting layer 12. Thereby, the light-emitting electrochemical cell 10 illustrated in FIG. 1 is obtained. The obtained light-emitting electrochemical cell 10 may be subjected to vacuum drying in view of improving the film quality of the light-emitting layer 12. The vacuum drying may be conducted at normal temperature or while heating the light-emitting electrochemical cell.

Figure 2A:
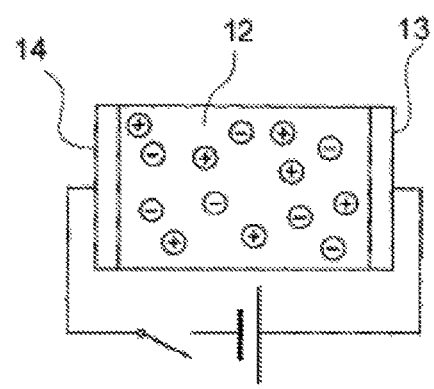
FIG. 2A illustrates the light-emitting electrochemical cell before applying voltage.
Figure 2B:
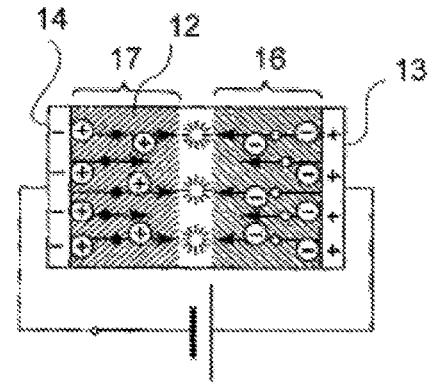
FIG. 2B illustrates the light-emitting electrochemical cell after applying voltage.

The light-emitting electrochemical cell 10 according to the present embodiments emits light by the following light emission mechanism. As illustrated in FIG. 2A and 2B, voltage is applied to the light-emitting layer 12 so that the first electrode 13 may be an anode and the second electrode 14 may be a cathode. Thereby, ions in the light-emitting layer 12 move along the electric field, and a layer where anionic species gather is formed in the light-emitting layer 12 near the interface with the first electrode 13. On the other hand, a layer where cationic species gather is formed in the light-emitting layer 12 near the interface with the second electrode 14. In this way, an electric double layer is formed on respective electrode interfaces. Thereby, a p-doped region 16 is spontaneously formed near the first electrode 13 being the anode, and an n-doped region 17 is formed near the second electrode 14 being the cathode. These doped regions compose a p-i-n junction. Thereafter, holes and electrons are injected into the light-emitting organic polymeric material in the light-emitting layer 12 from the anode and the cathode to recombine in the i layer. Excitons are generated from the recombined holes and electrons, and light is emitted when the excitons return to the ground state. In this way, light emission is obtained from the light-emitting layer 12. To obtain light having a desired wavelength, a light-emitting organic polymeric material whose energy difference (band gap) between the highest occupied molecular orbital and the lowest unoccupied molecular orbital corresponds to the desired wavelength may be selected.

The present invention has been described above based on the preferred embodiments; however, the present invention is not limited to these embodiments. The present invention further discloses the following light-emitting electrochemical cell.

[1]

A light-emitting electrochemical cell having: a light-emitting layer; and electrodes respectively disposed on faces of the light-emitting layer, the light-emitting layer containing: a light-emitting organic polymeric material; and a combination of two or more organic salts.

[2]

The light-emitting electrochemical cell according to [1], wherein the organic salts are each selected from phosphonium salts, ammonium salts, pyridinium salts, imidazolium salts, and pyrrolidinium salts.

[3]

The light-emitting electrochemical cell according to [1] or [2], wherein the organic salts are ionic liquids.

[4]

The light-emitting electrochemical cell according to any one of [1] to [3], wherein the organic salts are each represented by the following formula (1):

[Formula 2]

(1)

wherein $R_1$, $R_2$, $R_3$, and $R_4$ each represent an alkyl group, an alkoxyalkyl group, a trialkylsilylalkyl group, an alkenyl group, an alkynyl group, an aryl group, or a heterocyclic group which is optionally substituted with a functional group, $R_1$, $R_2$, $R_3$, and $R_4$ are the same or different, M represents N or P, and $X^-$ represents an anion.)

[5]

The light-emitting electrochemical cell according to [4], wherein a plurality of organic salts each represented by formula (1) are used as the organic salts, and all the organic salts are solid at normal temperature.

[6]

The light-emitting electrochemical cell according to [4], wherein a plurality of organic salts each represented by formula (1) are used as the organic salts, and all the organic salts are liquid at normal temperature.

[7]

The light-emitting electrochemical cell according to [4], wherein a plurality of organic salts each represented by formula (1) are used as the organic salts, at least one of the organic salts is liquid at normal temperature, and at least one of the organic salts is solid at normal temperature.

[8]

The light-emitting electrochemical cell according to any one of [4] to [7], wherein the light-emitting layer contains two organic salts each represented by formula (1), and the two organic salts contain the same cation and each contain a different anion.

[9]

The light-emitting electrochemical cell according to [8], wherein one of the different anions is bis(trifluoromethanesulfonyl)imide and the other is a halogen.

[10]

The light-emitting electrochemical cell according to any one of [4] to [7], wherein the light-emitting layer contains two organic salts each represented by formula (1), and the two organic salts contain the same anion and each contain a different cation. [11]

The light-emitting electrochemical cell according to [10], wherein each of the different cations is an ammonium ion or a phosphonium ion.

[12]

The light-emitting electrochemical cell according to [10], wherein one of the different cations is an ammonium ion, and the other is a phosphonium ion.

[13]

The light-emitting electrochemical cell according to any one of [4] to [12], wherein three of $R_1$, $R_2$, $R_3$, and $R_4$ in formula (1) represent the same alkyl group, and the other one is an alkyl group different from the alkyl group or an aromatic alkyl group.

[14]

A composition for forming a light-emitting layer of a light-emitting electrochemical cell, the composition containing: a light-emitting organic polymeric material; an organic solvent; and a combination of two or more organic salts.

EXAMPLES

Hereinafter, the present invention will be described in more detail giving Examples; however, the present invention is not limited to these Examples.

Example 1 and Comparative Example 1

Figure 3:
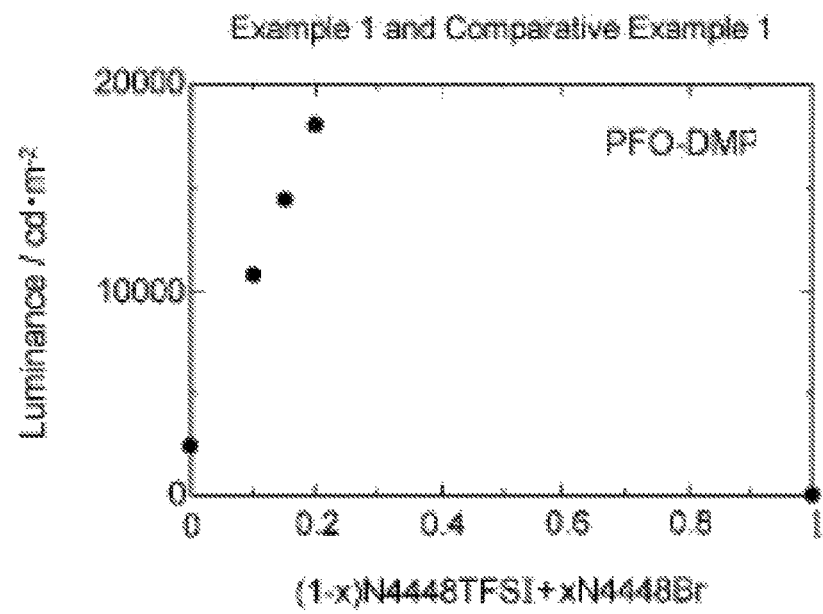
FIG. 3 is a graph showing measurement results of light emission luminance of light-emitting electrochemical cells obtained in Example and Comparative Example 1.

A commercially available glass substrate with an ITO film (manufactured by Geomatec Co., Ltd., ITO film thickness of 200 nm) was used as the first electrode. PFO-DMP (Poly (9,9-dioctylfluorenyl-2,7-diyl) end capped with dimethylphenyl, manufactured by Luminescence Technology Corp., Lt-S934, average molecular weight (Mn)=50000 to 150000) was used as a light-emitting organic polymeric material. A combination of an ionic liquid tributyloctylammonium bis(trifluoromethanesulfonyl)imide (N4448TFSI) and an ionic liquid tributyloctylammonium bromide (N4448Br) was used as organic salts. The mass ratios of the two were set as shown in FIG. 3(*a*) (in FIG. 3(*a*), horizontal axis x represents mass fraction. The same applies to FIG. 4 to FIG. 12 below.).

In a grove box under an argon atmosphere, a toluene solution of the light-emitting organic polymeric material (concentration: 9 g/L) and a toluene solution of each mixed ion liquid (concentration: 9 g/L) were mixed at room temperature in a volume ratio of the solution of the light-emitting organic polymeric material:the solution of the ion liquid=4:1 to prepare a composition for forming a light-emitting layer. Subsequently, in a grove box under an argon atmosphere, the composition for forming a light-emitting layer prepared above was applied on the first electrode of the glass substrate by spin coating at room temperature, and further, the glass substrate was heated on a 50° C. hot plate for 30 minutes to evaporate the organic solvent. In this way, a light-emitting layer in a solid form having a film thickness of 100 nm was formed. Further, the second electrode made of aluminum (Al) having a thickness of 30 nm was formed on the formed light-emitting layer by the above-described method. In this way, light-emitting electrochemical cells each including a portion to emit light, the portion having an area of 2 mm×2 mm square, were prepared.

The first electrode of the obtained light-emitting electrochemical cells was connected to an anode of a direct current, the second electrode was connected to a cathode, and voltage was applied up to 20 V to determine the highest value of luminance during the application of voltage as the light emission luminance. The light emission luminance was measured using CS-2000 (manufactured by Konica Minolta, Inc.). The results are shown in FIG. 3.

Example 2 and Comparative Example 2

Figure 4:
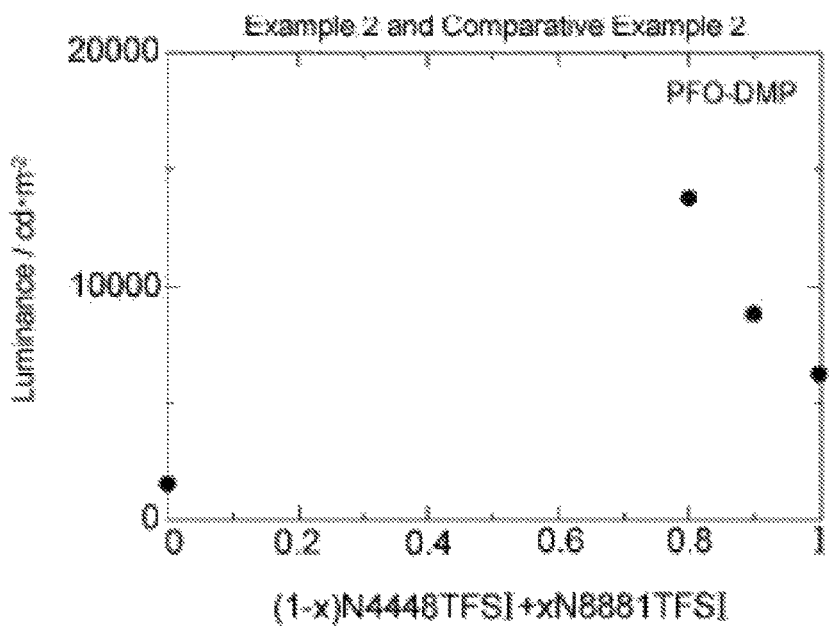
FIG. 4 is a graph showing measurement results of light emission luminance of light-emitting electrochemical cells obtained in Example 2 and Comparative Example 2.

A combination of an ionic liquid tributyloctylammonium bis(trifluoromethanesulfonyl)imide (N4448TFSI) and an ionic liquid trioctylmethylammonium bis(trifluoromethanesulfonyl)imide (N8881TFSI) was used as organic salts. The mass ratios of the two were set as shown in FIG. 4 (in FIG. 4, horizontal axis x represents mass fraction). Light-emitting electrochemical cells were prepared in the same manner as in Example 1 for the other conditions. The same measurement as in Example 1 was conducted for the obtained light-emitting electrochemical cells. The results are shown in FIG. 4.

Example 3 and Comparative Example 3

Figure 5:
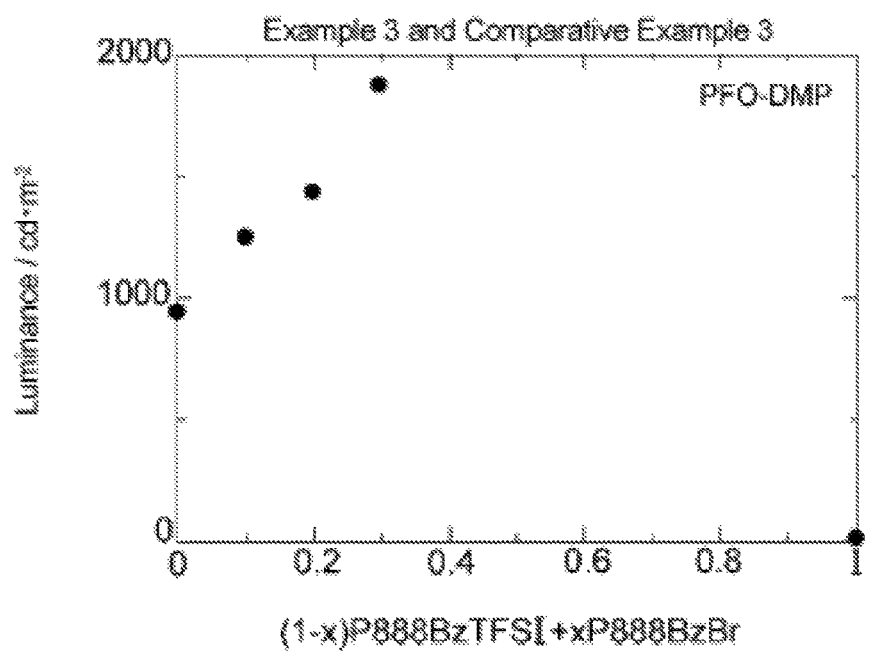
FIG. 5 is a graph showing measurement results of light emission luminance of light-emitting electrochemical cells obtained in Example 3 and Comparative Example 3.

A combination of an ionic liquid trioctylbenzylphosphonium bis(trifluoromethanesulfonyl)imide (P888BzTFSI) and an ionic liquid trioctylbenzylphosphonium bromide (P888BzBr) was used as organic salts. The mass ratios of the two were set as shown in FIG. 5. Light-emitting electrochemical cells were prepared in the same manner as in Example 1 for the other conditions. The same measurement as in Example 1 was conducted for the obtained light-emitting electrochemical cells. The results are shown in FIG. 5

Example 4 and Comparative Example 4

Figure 6:
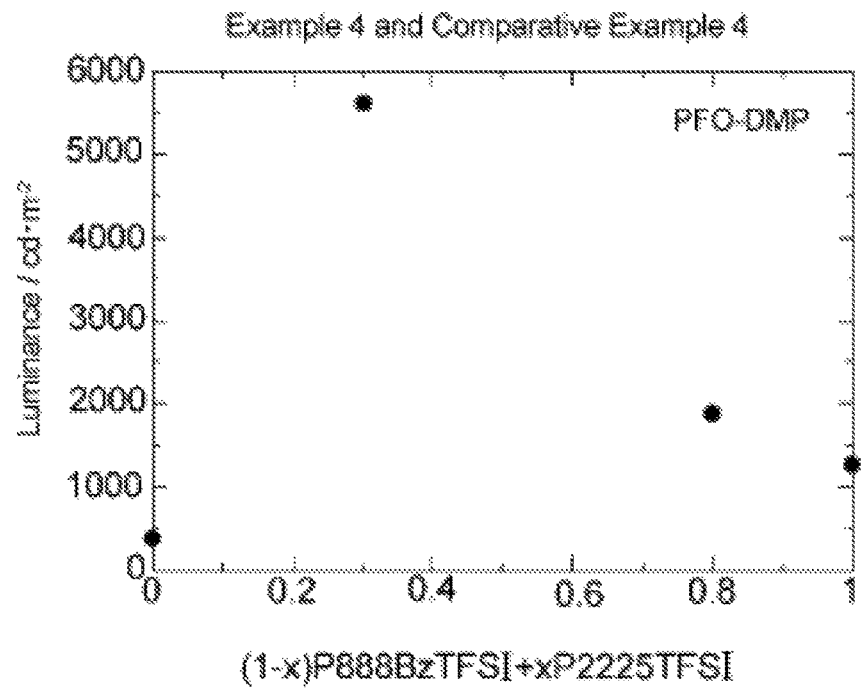
FIG. 6 is a graph showing measurement results of light emission luminance of light-emitting electrochemical cells obtained in Example 4 and Comparative Example 4.

A combination of an ionic liquid trioctylbenzylphosphonium bis(trifluoromethanesulfonyl)imide (P888BzTFSI) and an ionic liquid triethylpentylphosphonium bis(trifluoromethanesulfonyl)imide (P2225TFSI) was used as organic salts. The mass ratios of the two were set as shown in FIG. 6. Light-emitting electrochemical cells were prepared in the same manner as in Example 1 for the other conditions. The same measurement as in Example 1 was conducted for the obtained light-emitting electrochemical cells. The results are shown in FIG. 6.

Example 5 and Comparative Example 5

Figure 7:
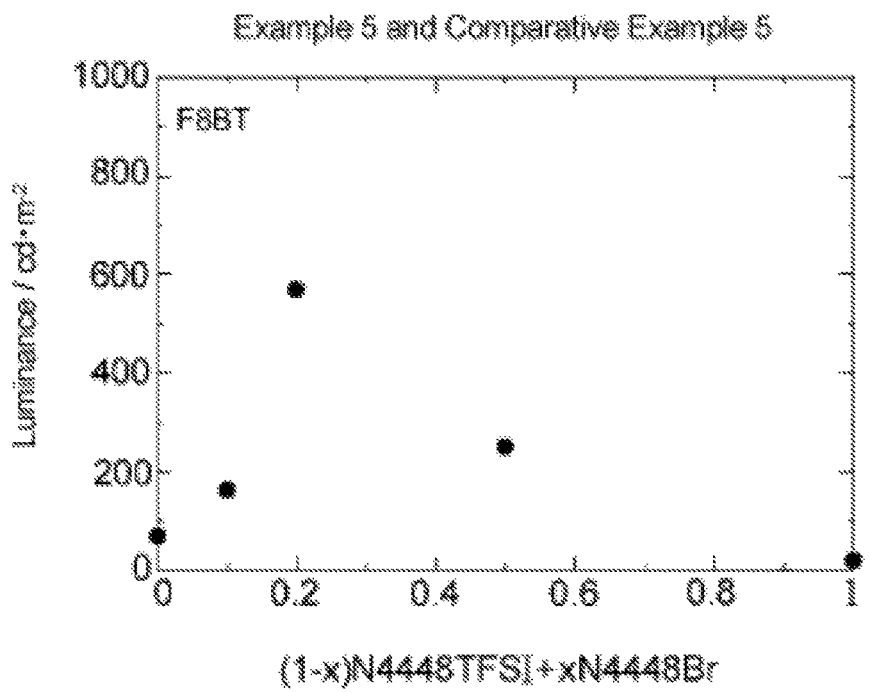
FIG. 7 is a graph showing measurement results of light emission luminance of light-emitting electrochemical cells obtained in Example 5 and Comparative Example 5.

A commercially available glass substrate with an ITO film (manufactured by Geomatec Co., Ltd., ITO film thickness of 200 nm) was used as the first electrode. F8BT (Poly[(9,9-di-n-octylfluorenyl-2,7-diyl)-alt-(benzo[2,1,3]thiadiazol-4,8-diyl)], manufactured by Sigma-Aldrich Co., LLC., average molecular weight (Mn)=10000 to 20000) was used as a light-emitting organic polymeric material. A combination of an ionic liquid tributyloctylammonium bis(trifluoromethanesulfonyl)imide (N4448TFSI) and an ionic liquid tributyloctylammonium bromide (N4448Br) was used as organic salts. The mass ratios of the two were set as shown in FIG. 7. Light-emitting electrochemical cells were prepared in the same manner as in Example 1 for the other conditions. The same measurement as in Example 1 was conducted for the obtained light-emitting electrochemical cells. The results are shown in FIG. 7.

Example 6 and Comparative Example 6

Figure 8:
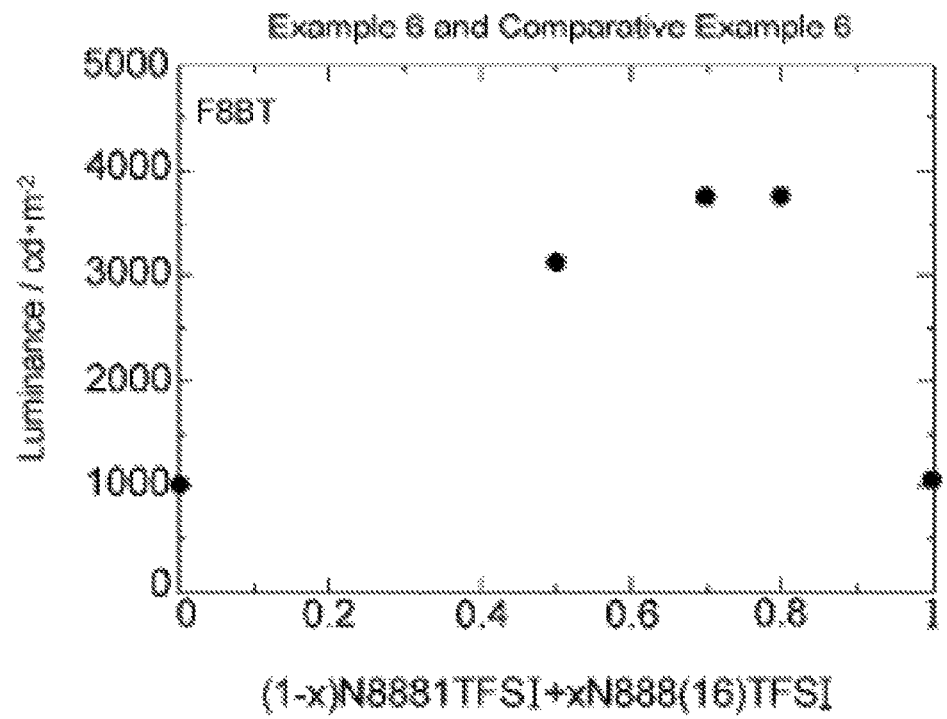
FIG. 8 is a graph showing measurement results of light emission luminance of light-emitting electrochemical cells obtained in Example 6 and Comparative Example 6.

A combination of an ionic liquid trioctylmethylammonium bis(trifluoromethanesulfonyl)imide (N8881TFSI) and an ionic liquid trioctylhexadecaammonium bis(trifluoromethanesulfonyl)imide (N888(16)TFSI) was used as organic salts. The mass ratios of the two were set as shown in FIG. 8. Light-emitting electrochemical cells were prepared in the same manner as in Example 5 for the other conditions. The same measurement as in Example 5 was conducted for the obtained light-emitting electrochemical cells. The results are shown in FIG. 8.

Example 7 and Comparative Example 7

Figure 9:
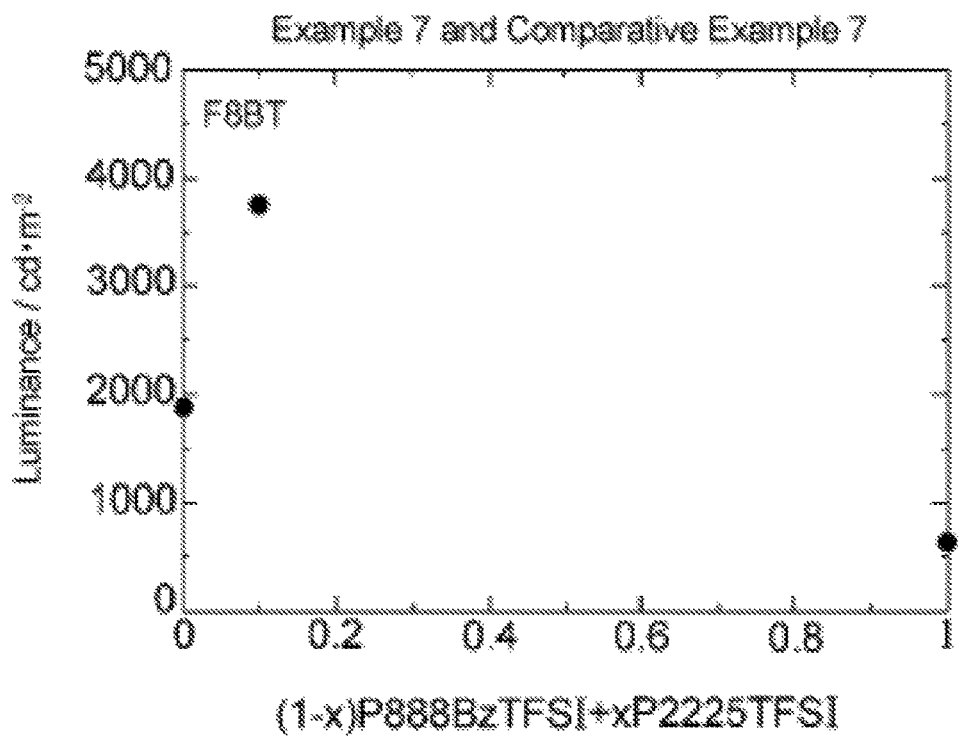
FIG. 9 is a graph showing measurement results of light emission luminance of light-emitting electrochemical cells obtained in Example 7 and Comparative Example 7.

A combination of an ionic liquid trioctylbenzylphosphonium bis(trifluoromethanesulfonyl)imide (P888BzTFSI) and an ionic liquid triethylpentylphosphonium bis(trifluoromethanesulfonyl)imide (P2225TFSI) was used as organic salts. The mass ratios of the two were set as shown in FIG. 9. Light-emitting electrochemical cells were prepared in the same manner as in Example 5 for the other conditions. The same measurement as in Example 5 was conducted for the obtained light-emitting electrochemical cells. The results are shown in FIG. 9.

Example 8 and Comparative Example 8

Figure 10:
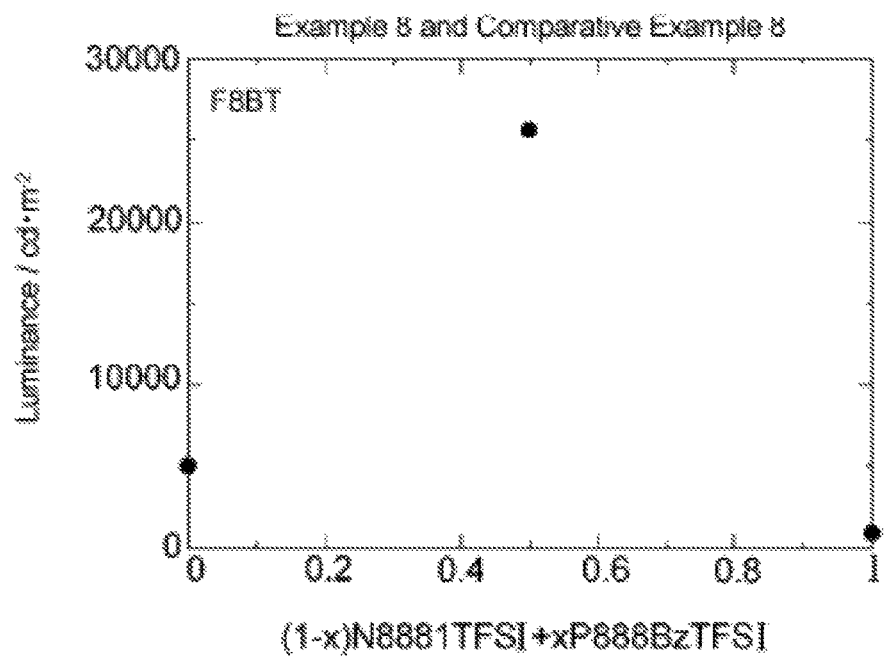
FIG. 10 is a graph showing measurement results of light emission luminance of light-emitting electrochemical cells obtained in Example 8 and Comparative Example 8.

A combination of an ionic liquid trioctylmethylammonium bis(trifluoromethanesulfonyl)imide (N8881TFSI) and an ionic liquid trioctylbenzylphosphonium bis(trifluoromethanesulfonyl)imide (P888BzTFSI) was used as organic salts. The mass ratios of the two were set as shown in FIG. 10. Light-emitting electrochemical cells were prepared in the same manner as in Example 5 for the other conditions. The same measurement as in Example 5 was conducted for the obtained light-emitting electrochemical cells. The results are shown in FIG. 10.

Example 9 and Comparative Example 9

Figure 11:
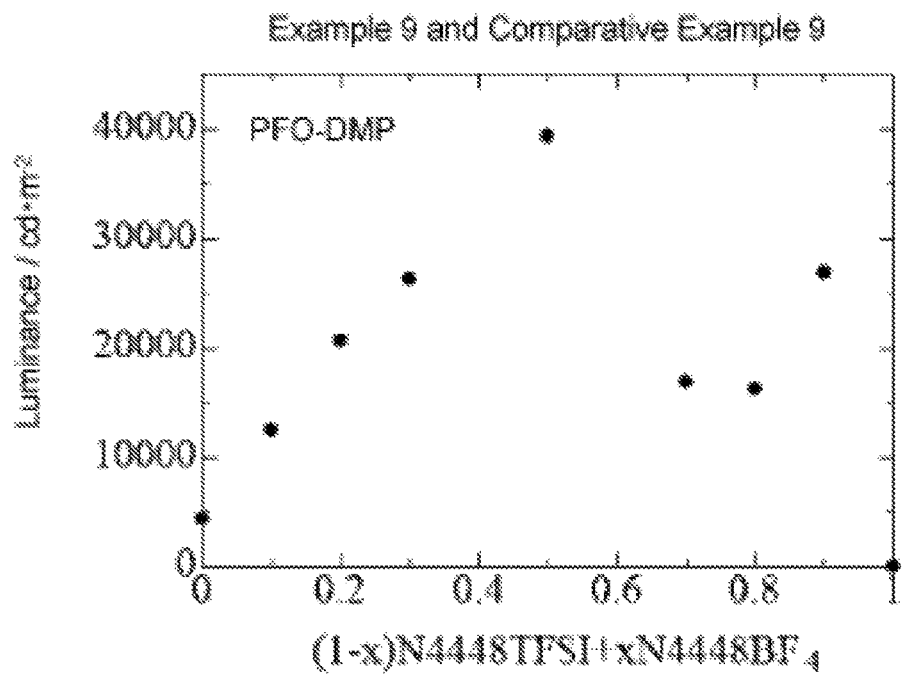
FIG. 11 is a graph showing measurement results of light emission luminance of light-emitting electrochemical cells obtained in Example 9 and Comparative Example 9.

A combination of an ionic liquid tributyloctylammonium bis(trifluoromethanesulfonyl)imide (N4448TFSI) and tributyloctylammonium tetrafluoroborate (N4448BF$_4$) in a solid form was used as organic salts. The mass ratios of the two were set as shown in FIG. 11. Light-emitting electrochemical cells were prepared in the same manner as in Example 1 for the other conditions. The same measurement as in Example 1 was conducted for the obtained light-emitting electrochemical cells. The results are shown in FIG. 11.

Examples 10 and Comparative Example 10

Figure 12:
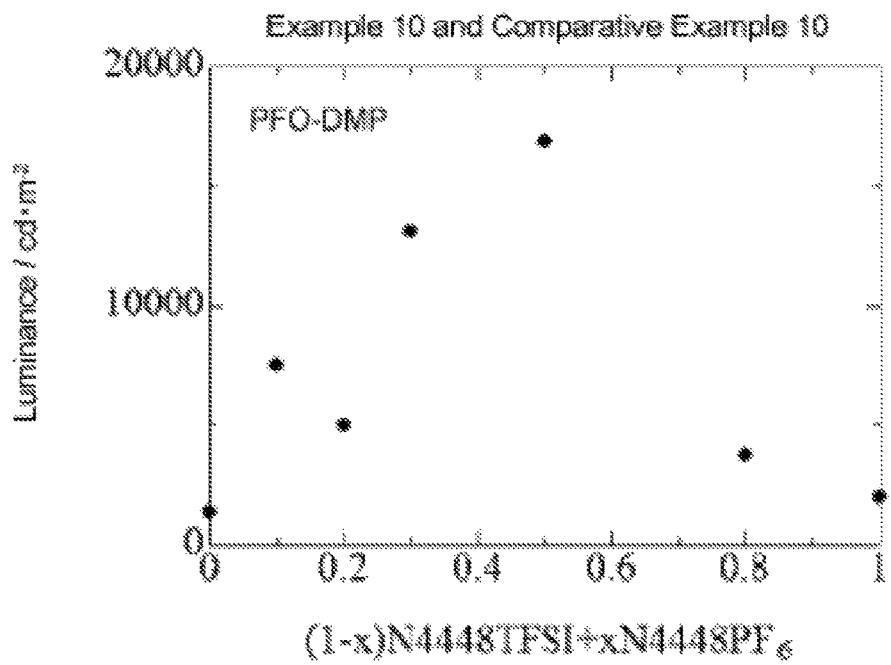
FIG. 12 is a graph showing measurement results of light emission luminance of light-emitting electrochemical cells obtained in Example 10 and Comparative Example 10.

A combination of an ionic liquid tributyloctylammonium bis(trifluoromethanesulfonyl)imide (N4448TFSI) and tributyloctylammonium hexafluorophosphate (N4448PF$_6$) in a solid form was used as organic salts. The mass ratios of the two were set as shown in FIG. 12. Light-emitting electrochemical cells were prepared in the same manner as in Example 1 for the other conditions. The same measurement as in Example 1 was conducted for the obtained light-emitting electrochemical cells. The results are shown in FIG. 12.

Example 11 and Comparative Example 11

Figure 13:
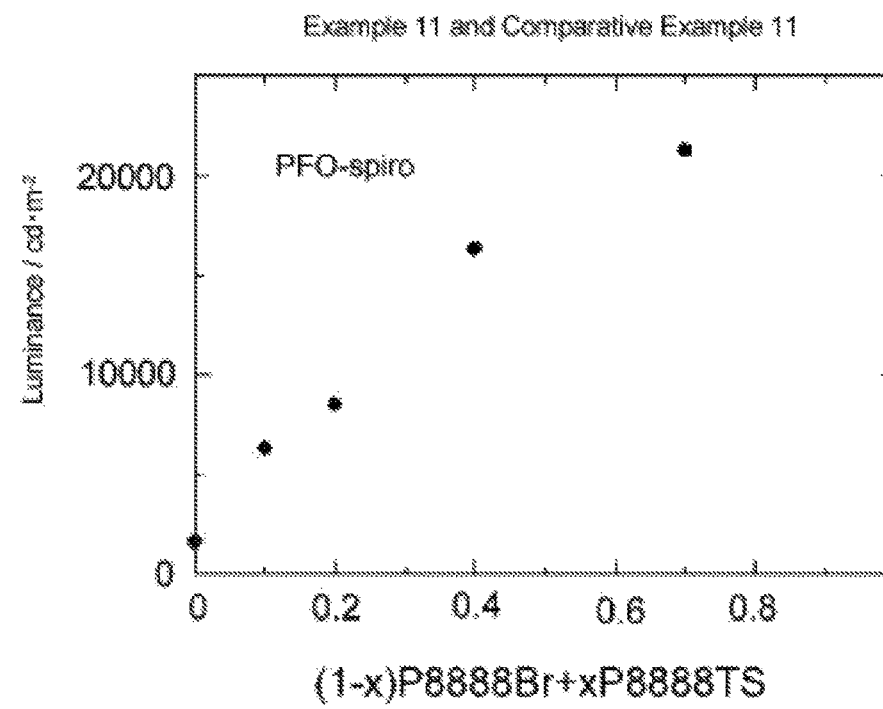
FIG. 13 is a graph showing measurement results of light emission luminance of light-emitting electrochemical cells obtained in Example 11 and Comparative Example 11.

A commercially available glass substrate with an ITO film (manufactured by Geomatec Co., Ltd., ITO film thickness of 200 nm) was used as the first electrode. PFO-Spiro (Poly[(9,9-dioctylfluorenyl-2,7-diyl)-alt-co-(9,9'-spirobifluorene-2,7-diyl)], manufactured by Solaris Chem Inc., product number SOL2412) was used as a light-emitting organic polymeric material. A combination of tetraoctylphosphonium bromide (P8888Br) in a solid form and tetraoctylphosphonium para-toluenesulfonate (P8888TS) in a solid form was used as organic salts. The mass ratios of the two were set as shown in FIG. 13. Light-emitting electrochemical cells were prepared in the same manner as in Example 1 for the other conditions. The same measurement as in Example 1 was conducted for the obtained light-emitting electrochemical cells. The results are shown in FIG. 13.

Example 12 and Comparative Example 12

Figure 14:
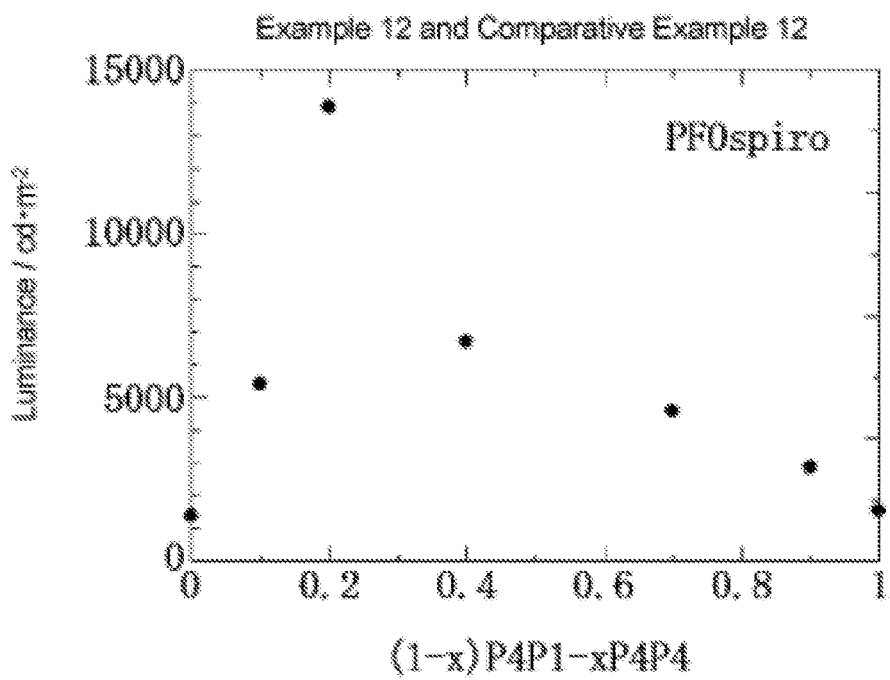
FIG. 14 is a graph showing measurement results of light emission luminance of light-emitting electrochemical cells obtained in Example 12 and Comparative Example 12.

A commercially available glass substrate with an ITO film (manufactured by Geomatec Co., Ltd., ITO film thickness of 200 nm) was used as the first electrode. PFO-Spiro (Poly[(9,9-dioctylfluorenyl-2,7-diyl)-alt-co-(9,9'-spirobifluorene-2,7-diyl)], manufactured by Solaris Chem Inc., product number SOL2412) was used as a light-emitting organic polymeric material. A combination of tetrabutylphosphonium dibutyl phosphate (P4P4) in a solid form and tetrabutylphosphonium dimethyl phosphate (P4P1) in a liquid form was used as organic salts. The mass ratios of the two were set as shown in FIG. 14. Light-emitting electrochemical cells were prepared in the same manner as in Example 1 for the other conditions. The same measurement as in Example 1 was conducted for the obtained light-emitting electrochemical cells. The results are shown in FIG. 14.

As is clear from the results shown in FIG. 3 to FIG. 14, it is understood that the light emission luminance increases more when combinations of two organic salts are used than when a single organic salt is used.

REFERENCE SIGNS LIST

10 Light-emitting electrochemical cell
12 Light-emitting layer
13 First electrode
14 Second electrode
16 p-Doped region
17 n-Doped region

The invention claimed is:

1. A light-emitting electrochemical cell comprising:
a light-emitting layer; and
electrodes respectively disposed on faces of the light-emitting layer,
the light-emitting layer comprising:
a light-emitting organic polymeric material;
a combination of two or more organic salts;
wherein each organic salt is a phosphonium salt;
wherein the combination of organic salts is organic salts whose cations and anions are the same and different, respectively;
wherein molecular weight of a cation in each organic salt is 270 or higher and 900 or lower;
wherein the organic salts are each represented by formula (1):

[Formula 1]

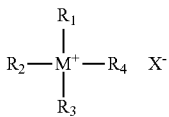
(1)

wherein three of R1, R2, R3, and R4 in formula (1) represent the same alkyl group, and the other one is a aromatic alkyl group; M represents P; and X- represents an anion.

2. The light-emitting electrochemical cell according to claim 1, wherein the two or more organic salts are a combination of liquid organic salts.

3. The light-emitting electrochemical cell according to claim 1, wherein the two or more organic salts are a combination of solid organic salts.

4. The light-emitting electrochemical cell according to claim 1, wherein the combination of two or more organic salts is a combination of at least one liquid organic salt and at least one solid organic salt.

5. A composition for forming a light-emitting layer of a light-emitting electrochemical cell, the composition comprising:
a light-emitting organic polymeric material;
an organic solvent;
a combination of two or more organic salts;
wherein each organic salt is a phosphonium salt;
wherein the combination of organic salts is organic salts whose cations and anions are the same and different, respectively;
wherein molecular weight of a cation in each organic salt is 270 or higher and 900 or lower;
wherein the organic salts are each represented by formula (1):

[Formula 2]

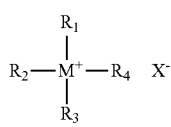
(1)

wherein three of R1, R2, R3, and R4 in formula (1) represent the same alkyl group, and the other one is an aromatic alkyl group; M represents P; and X- represents an anion.

6. The composition according to claim 5, wherein the two or more organic salts are a combination of liquid organic salts.

7. The composition according to claim 5, wherein the two or more organic salts are a combination of solid organic salts.

8. The composition according to claim 5, wherein the combination of two or more organic salts is a combination of at least one liquid organic salt and at least one solid organic salt.

9. The composition according to claim 5, wherein the organic solvent is toluene, benzene, tetrahydrofuran, dimethyl chloride, chlorobenzene, or chloroform.

10. A light-emitting electrochemical cell using the composition according to claim 5 as a material for forming a light-emitting layer.

* * * * *